United States Patent [19]
Braceras et al.

[11] Patent Number: 5,751,648
[45] Date of Patent: May 12, 1998

[54] TWO STAGE SENSING FOR LARGE STATIC MEMORY ARRAYS

[75] Inventors: George M. Braceras, Colchester; Donald A. Evans, Williston, both of Vt.

[73] Assignee: International Business Machines Corporation, Armonk, N.Y.

[21] Appl. No.: 792,005

[22] Filed: Jan. 31, 1997

[51] Int. Cl.[6] .................................................. G11C 7/00
[52] U.S. Cl. ...................................... 365/205; 327/57
[58] Field of Search ................................ 365/205; 327/57

[56]  References Cited

U.S. PATENT DOCUMENTS

| | | | |
|---|---|---|---|
| 5,023,841 | 6/1991 | Akrout et al. | 365/205 |
| 5,257,226 | 10/1993 | McClure | 365/189.09 |
| 5,307,317 | 4/1994 | Shiraishi et al. | 365/205 |
| 5,321,659 | 6/1994 | Taguchi | 365/207 |
| 5,477,497 | 12/1995 | Park et al. | 365/205 |
| 5,508,966 | 4/1996 | Nakase | 365/208 |
| 5,526,314 | 6/1996 | Kumar | 365/207 |
| 5,534,800 | 7/1996 | Hiraki et al. | 327/57 |
| 5,539,700 | 7/1996 | Kawahara et al. | 365/203 |
| 5,552,728 | 9/1996 | Lin | 327/57 |

*Primary Examiner*—David C. Nelms
*Assistant Examiner*—Hoai V. Ho
*Attorney, Agent, or Firm*—Whitham, Curtis & Whitham; Robert A. Walsh

[57] ABSTRACT

A two stage latch sensing circuit provides high performance at low power in static random access memory (SRAM) devices. The first stage takes the small signal development from the array bitlines which is passed to the sense latch through bit-switches and amplifies it. P-type field effect transistor (PFET) devices are used to drive a precharged high, low-signal swing read data bus. The second stage sense latch amplifies the signal from the read data bus, thereby providing a full level swing to the outputs.

4 Claims, 1 Drawing Sheet

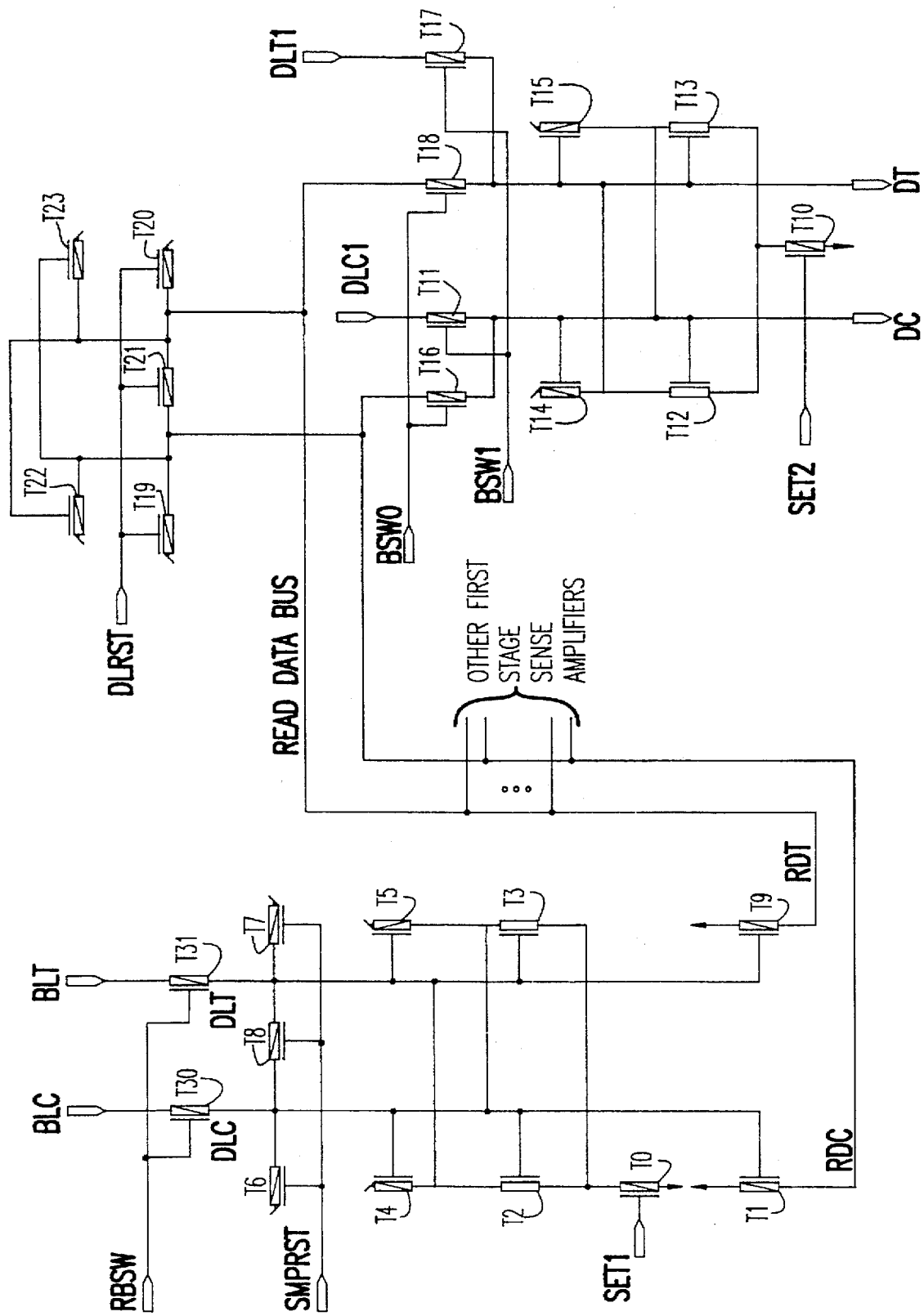

TWO STAGE SENSING FOR LARGE STATIC MEMORY ARRAYS

BACKGROUND OF THE INVENTION

1. Field of the Invention

The present invention generally relates to computer memory devices and, more particularly, to a two stage sensing technique for large static memory arrays.

2. Background Description

Static random access memory (SRAM) devices fabricated using complementary metal oxide semiconductor (CMOS) technology use dynamic, self-resetting circuits for high performance. Low-signal swing and static circuits are required for lower power memory devices. This, in turn, can cause misdetection of signals on bit lines and glitches in the output of the memory device.

Prior art techniques specific to latch sensing include the use of full signal swing differential read data buses and pulsed low signal swing read data buses driven by n-type field effect transistors (NFETs). Full signal swing buses use a great deal of power and generate considerable noise. Low signal swing buses driven by NFETs are difficult to design for reliable power savings and design margin. NFETs driving low signal swing buses must be pulsed. If the pulse is too wide, the bus could be completely discharged, thus saving very little power. If the pulse is too narrow, the data may not be captured at the other end of the bus. Designing the correct pulse width across technology process corners may be difficult to achieve.

SUMMARY OF THE INVENTION

It is therefore an object of the present invention to provide a way to minimize power requirements in SRAM devices yet ensure reliable operation.

According to the invention, there is provided a two stage latch sensing circuit that provides high performance at low power in SRAM devices. The first stage takes the small signal development from the array bitlines which is passed to the sense latch through bit-switches and amplifies it. P-type field effect transistor (PFET) devices are used to drive a precharged high, low-signal swing read data bus. The second stage sense latch amplifies the signal from the read data bus, thereby providing a full level swing to the outputs.

BRIEF DESCRIPTION OF THE DRAWING

The foregoing and other objects, aspects and advantages will be better understood from the following detailed description of a preferred embodiment of the invention with reference to the drawings, in which the sole FIGURE is a schematic diagram of the two stage sensing circuit according to a preferred embodiment of the invention.

DETAILED DESCRIPTION OF A PREFERRED EMBODIMENT OF THE INVENTION

Referring now to the sole FIGURE of the drawing, there is shown the topology of the two stages of latch sense amplifiers according to the invention. The first stage takes the small signal development from the memory array bitlines BLC and BLT which is passed to the sense latch nodes DLC and DLT and then amplified in response to the strobe signal SET1. The small signals on bitlines BLC and BLT are passed through bit-switches comprising p-type field effect transistors (PFETS) T30 and T31. The PFETs T30 and T31 are conductive in response to the read bit switch (RBSW) signal. The PFETs T6, T7 and T8 are responsive to signal SMPRST to precharge the sense latch nodes DLC and DLT between accesses.

The sense latch is composed of a cross-coupled inverter pair. PFET T4 and n-type field effect transistor (NFET) T2 comprise one inverter, and PFET T5 and NFET T3 comprise the other inverter of the cross-coupled inverter pair. When the strobe signal SET1 is asserted at the gate of NFET TO, either node DLC or DLT is pulled low depending on the state of the memory cell accessed. This in turn activates either PFET T1 or PFET T9 to pull either RDC or RDT to some mid-level value of VDD. RDC and RDT comprise the read data bus and are precharged to VDD by PFETs T19, T20, and T21 in response to signal DLRST between accesses to restore the read data bus to VDD after use and to maintain the bus at the precharged state prior to use. The PFETs T22 and T23 are for noise reduction in the precharge circuit for the read data bus.

By using PFETs T1 and T9 to drive the read data bus, a low signal swing read data bus is achieved, and the bus is activated sooner than if NFETs were used. To use NFETs (as in the prior art) would require the opposite polarity, so another inverter stage would be required to drive the NFETs. Also, the gates of the NFETs would have to be pulsed to guarantee a low signal swing. If the pulse is too wide, the bus would be pulled all the way to ground which would not save much power. If the pulse is too short, the data may not be captured at the end of the bus.

The second stage sense latch comprises cross-coupled inverters composed of PFET T10, NFET T12 and PFET 15, NFET 13. This sense latch amplifies the signal from the read data bus when the strobe signal SET2 is asserted at the gate of NFET T10, thereby providing full level swing for outputs DC and DT. The strobes SET1 and SET2, as well as the other control signals (e.g., SMPRST, DLRST), are generated by dummy timing paths which determine when adequate signal development of the sense latch nodes has been achieved. For example, a strobe (SET1) from the circuitry controlling the first stage can be sent to trigger the circuitry controlling the second stage in order to achieve the proper timings.

Bit switches in the form of PFETs T16, T24, T18, and T17 can be used for additional data steering and can be used to divide the read data bus into two or more segments to reduce the capacitance of each read data bus segment. Signals BSW0 and BSW1 select which read data bus segment is steered to the second stage of the sense latch. This data steering also improves performance.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A two stage latch sensing circuit for static random access memory (SRAM) devices comprising:

a first stage connected to receive small signals from SRAM array bitlines, said first stage including a first sense latch receiving the small signals through bit-switches;

first and second p-type field effect transistor (PFET) devices responsive to respective first and second outputs of the first sense latch to drive a precharged high, low-signal swing read data bus; and a second stage connected to the read data bus, said second stage including a second sense latch which amplifies a signal from the read data bus, thereby providing a full level swing to outputs.

2. The two stage latch sensing circuit according to claim 1 further comprising means for precharging the read data bus high between accesses.

3. The two stage latch sensing circuit according to claim 2 wherein said first sense latch comprises first and second cross-coupled inverters connected in common to an FET device which is conductive in response to a first strobe signal to pull a first or second line of the read data bus to a voltage less than the precharged voltage depending on states of the outputs of the first sense latch at the time of the first strobe signal.

4. The two stage latch sensing circuit according to claim 3 further comprising bit steering means connected between the second stage and the read data bus for dividing the read data bus into two or more segments to reduce a capacitance of each read data bus segment.

* * * * *